United States Patent [19]
Sumita et al.

[11] Patent Number: 5,883,458
[45] Date of Patent: *Mar. 16, 1999

[54] TERMINAL FOR A PIEZOELECTRIC DEVICE

[75] Inventors: Manabu Sumita, Toyama; Sigemasa Kusabiraki, Takaoka; Isao Ikeda, Toyama, all of Japan

[73] Assignee: Murata Manufacturing Co., Ltd., Kyoto, Japan

[ * ] Notice: The term of this patent shall not extend beyond the expiration date of Pat. No. 5,770,915.

[21] Appl. No.: 949,721

[22] Filed: Oct. 14, 1997

Related U.S. Application Data

[63] Continuation-in-part of Ser. No. 690,534, Jul. 31, 1996, Pat. No. 5,770,915.

[30] Foreign Application Priority Data

Jul. 31, 1995 [JP] Japan .................................. 7-215264
Jan. 24, 1997 [JP] Japan .................................. 9-026152

[51] Int. Cl.$^6$ .................................................. H01L 41/08
[52] U.S. Cl. .......................... 310/326; 310/344; 310/355
[58] Field of Search ..................................... 310/344, 348, 310/354, 355, 363–365

[56] References Cited

U.S. PATENT DOCUMENTS 5,616,981  4/1997  Nagano et al. ..................... 310/355 X

*Primary Examiner*—Mark O. Budd
*Attorney, Agent, or Firm*—Graham & James LLP

[57] ABSTRACT

A terminal for a piezoelectric device has a first contact portion and a second contact portion which are preferably formed as separate metallic elements. Each contact portion has a protrusion disposed thereon. A lubricant is located between the first contact portion and the second contact portion. The lubricant contains a hydrophilic group tending to form a hydrogen bond with a metal element and a lipophilic group extending in a straight chain from any such hydrogen bond and having a length at least several times that of the hydrophilic group. The lipophilic group has a molecular structure which urges away from the metallic surfaces of the contact portions.

20 Claims, 8 Drawing Sheets

TERMINAL FOR A PIEZOELECTRIC DEVICE

This application is a Continuation-in-Part Application of U.S. patent application Ser. No. 08/690,534 filed on Jul. 31, 1996, now U.S. Pat. No. 5,770,915.

BACKGROUND OF THE INVENTION

1. Field of the Invention

This invention relates to a terminal for a piezoelectric device, and more particularly, to a terminal which has a bent contact portion or includes two separately formed, opposed contact portions and is adapted for use as, for example, an input terminal, an output terminal, an internal connecting terminal, or an earth terminal for a piezoelectric device, such as a ladder type filter.

2. Description of the Prior Art

A ladder type filter is shown in FIG. 11, by way of example, as a piezoelectric device having known terminals forming the background of this invention, including an output terminal as shown in FIG. 12. The ladder type filter 1 includes a casing 2 formed from a synthetic resin and having a bottom opening closed by a cover 3. The casing 2 contains four piezoelectric resonators 4a, 4b, 4c and 4d, and an input terminal 5a, a relay terminal 5b, an earth terminal 5c, an output terminal 5d and a spring terminal 5e for interconnecting the piezoelectric resonators 4a, 4b, 4c and 4d.

The earth terminal 5c, the output terminal 5d and one contact portion 6b of the relay terminal 5b are each formed as a bent terminal having a U-shaped cross section. Referring more specifically to the output terminal 5d, it has a substantially square base portion 5d1, as shown in FIG. 12. The base portion 5d1 has a straight leg 7d extending outwardly to define an external connector. The output terminal 5d also has a bent portion 5d2 extending parallel to its base portion 5d1 and spaced apart from the base portion 5d1 by a small distance. The base portion 5d1 has on its outer surface a protrusion 8 resiliently disposed against one principal surface of the piezoelectric resonator 4c and the bent portion 5d2 likewise has on its outer surface a protrusion 8 resiliently disposed against one principal surface of the piezoelectric resonator 4d.

Likewise, the earth terminal 5c is formed as a bent terminal having a base portion 5c1, a bent portion 5c2 and two protrusions 8. One contact portion 6b of the relay terminal 5b also has a base portion 6b1, a bent portion 6b2 and two protrusions 8. Moreover, the input terminal 5a has a protrusion 8 resiliently disposed against one principal surface of the piezoelectric resonator 4a and the other contact portion 6c has a protrusion 8 resiliently disposed against the other principal surface of the piezoelectric resonator 4d.

The ladder type filter 1 also has a plurality of sheets 9 formed of a synthetic resin, such as silicone rubber, including one sheet 9 interposed between the base portion 5d1 and the bent portion 5d2 of the output terminal 5d. The resin sheets 9 are provided for protecting the piezoelectric resonators 4a, 4b, 4c and 4d from an external shock by providing a shock absorbing force in a direction extending along a thickness of the sheets 9 and perpendicular to the opposing major surfaces of the base portion 5d1 and the bent portion 5d2 surrounding the sheet 9 as seen in FIG. 12.

However, the sheets 9 may cause problems in the filter 1 shown in FIG. 11. For example, the sheets 9 may be displaced or moved from a desired position between the bent portion and base portion of the terminals, especially if a shock or stress applied to the filter 1 is substantial. Also, although the resin sheets in the known ladder type filter 1 as described above are effective for protecting the piezoelectric resonators from a shock when the filter has been dropped or hit hard, the application of physical stress from an external source or vibration of the piezoelectric resonators per se, is likely to cause a ripple failure in the frequency and group delay characteristics of the filter. More specifically, the sheets 9 create an obstruction to oscillation or vibration between the bent portion and base portion of any terminal, in a direction that is parallel to the major surfaces of the bent portion and base portion which surround the sheets. This obstruction of vibration causes an unbalanced vibration, other than the desired piezoelectric vibration, between the piezoelectric element and the bent portion of the terminal. Consequently, a ripple failure occurs in the frequency and group delay characteristics of the filter and lowers the filter characteristic quality.

As a result of the ripple failure, or the distortion in waveform of frequency characteristics which occurs in a filter band, the group delay and phase characteristics of the filter are deteriorated. Consequently, the use of the ladder type filter in a communication system results in increasing of undesired demodulation distortion and distortion of any sound thereby received, or the appearance of bit errors in a digital communication system which causes problems in data communications.

SUMMARY OF THE INVENTION

To overcome the problems described above, the preferred embodiments of the present invention provide a terminal for a piezoelectric device which prevents any ripple failure in the frequency and group delay characteristics of the device and stabilizes the electrical characteristics of the piezoelectric device, while still protecting piezoelectric resonators of the piezoelectric device against shock when the piezoelectric device is dropped or hit hard.

In a preferred embodiment of the present invention, a terminal for a piezoelectric device comprises a contact portion formed by folding a metallic material into a base portion and a bent portion, a protrusion formed on each of the base and bent portions, and a lubricant applied between the base and bent portions, the lubricant containing a hydrophilic group tending to form a hydrogen bond with a metal element and a lipophilic group extending in a straight chain from any such hydrogen bond and having a length at least several times that of the hydrophilic group, the lipophilic group having a molecular structure which urges it away from the metallic surfaces of the base and bent portions.

In another preferred embodiment of the present invention, a terminal for a piezoelectric device comprises two separate contact portions disposed opposite to each other, a protrusion formed on each of the two separate contact portions, and a lubricant applied between the two separate contact portions, the lubricant containing a hydrophilic group tending to form a hydrogen bond with a metal element and a lipophilic group extending in a straight chain from any such hydrogen bond and having a length at least several times that of the hydrophilic group, the lipophilic group having a molecular structure which urges it away from the metallic surfaces of the base and bent portions.

The lubricant preferably comprises a non-ionic surface active agent except one having a cyclic molecular structure as a whole, or a higher fatty acid ester except one having a cyclic molecular structure as a whole.

The lubricant prevents any unbalanced vibration from occurring between the base and bent portions of the terminal or between the two separate contact portions, while still protecting piezoelectric resonators of the piezoelectric device against shock when the piezoelectric device is dropped or hit hard.

The lubricant also prevents any obstruction of vibration between the bent portion and base portion or between the two separate portions of any terminal. Therefore, no unstable vibration occurs between the terminal and the bent portion or between the two separate portions of the terminal, even if noise may propagate from an external source or the piezoelectric element. Thus, it is possible to minimize any distortion of waveform caused by any shock or vibration from an external source and eliminate any distortion occurring between the piezoelectric element and the terminal.

The preferred embodiments of the present invention prevent any ripple failure from occurring in the frequency and group delay characteristics of the piezoelectric device, avoid any adverse effect on the electrical characteristics of the filter at a main frequency thereof and raise the filter quality.

The above and other elements, features and advantages of the preferred embodiments of the present invention will become more apparent from the following description and the accompanying drawings.

DETAILED DESCRIPTION OF PREFERRED EMBODIMENTS

Figure 1A:
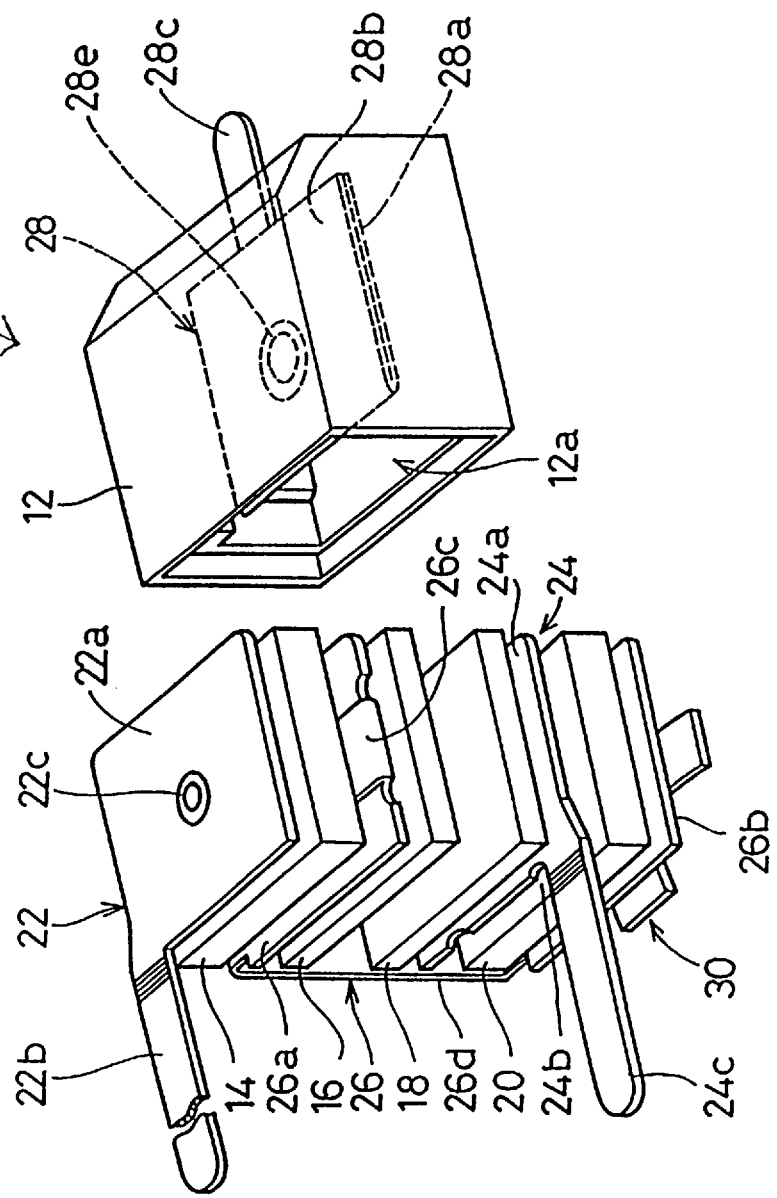
FIG. 1A is an exploded perspective view of a ladder type filter including terminals according to a preferred embodiment of the present invention.
Figure 1B:
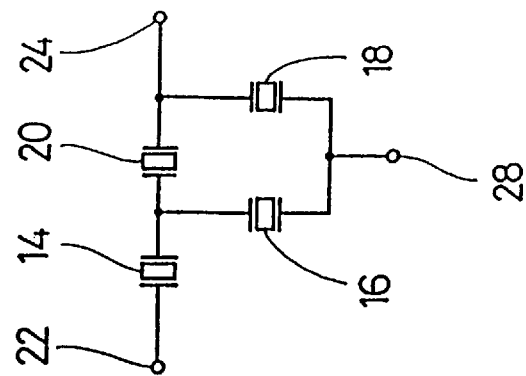
FIG. 1B is a diagram showing an equivalent circuit of the filter shown in FIG. 1.
Figure 2:
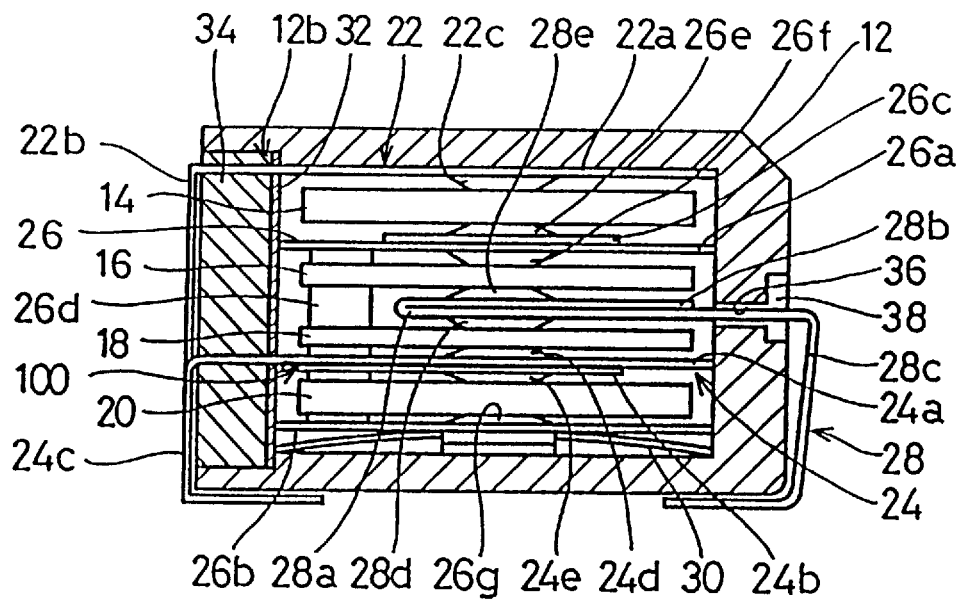
FIG. 2 is a cross-sectional view of the filter shown in FIGS. 1A and 1B;.

A ladder type filter is shown by way of example in FIGS. 1A, 1B and 2 as a piezoelectric device including terminals according to the preferred embodiments of the present invention. The ladder type filter 10 preferably includes a casing 12 formed from, for example, a synthetic resin, such as a liquid crystal polymer, a ceramic material or other suitable material. The casing 12 is substantially U-shaped in cross section and has an opening $12a$ located on one side thereof. The casing 12 preferably holds four piezoelectric elements 14, 16, 18 and 20 which are known in the art and are each provided with an electrode on each of its upper and lower surfaces.

The casing 12 also holds an input terminal 22, an output terminal 24, a relay terminal 26, an earth terminal 28 and a spring terminal 30 formed from a cross-shaped leaf spring. The input terminal 22 has a substantially rectangular contact portion $22a$, an external connector $22b$ and a protrusion $22c$ formed on its lower surface and resiliently disposed against the upper surface of the piezoelectric element 14.

Figure 3A:
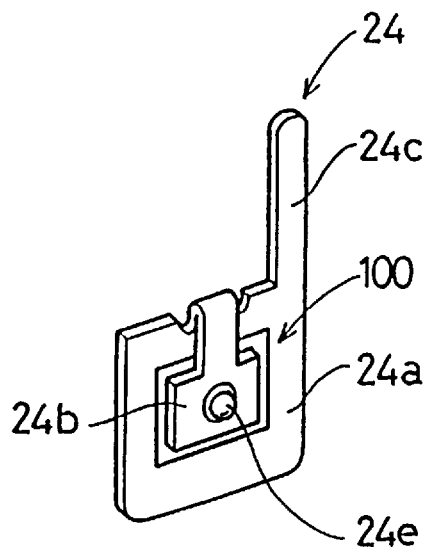
FIG. 3A is a perspective view of the output terminal having a bent portion in the filter shown in FIG. 1A, 1B and 2.
Figure 6:
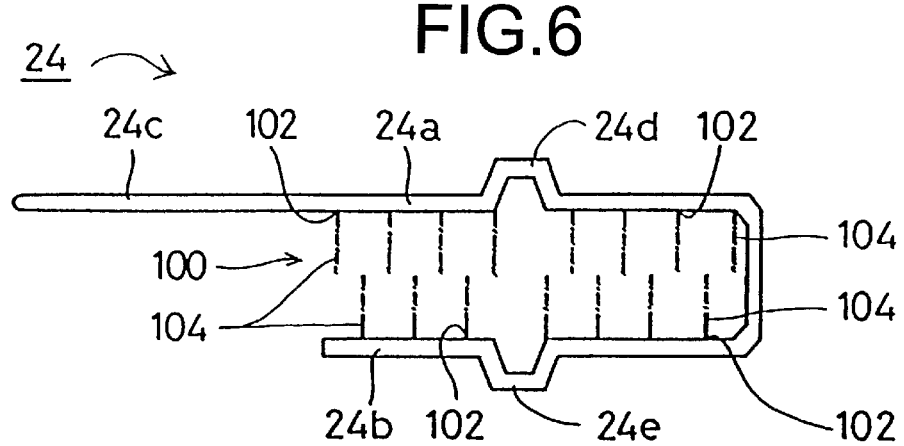
FIG. 6 is a view showing a lubricant applied between the base and bent portions of the terminal shown in FIG. 3A.

The output terminal 24 has a base contact portion $24a$, a bent contact portion $24b$ folded over the base contact portion $24a$, an external connector $24c$ and two protrusions $24d$ and $24e$, as shown also in FIGS. 3A and 6. The protrusion $24d$ is formed on the base contact portion $24a$ and resiliently disposed against the lower surface of the piezoelectric element 18, while the other protrusion $24e$ is formed on the bent contact portion $24b$ and resiliently disposed against the upper surface of the piezoelectric element 20.

The filter 10 preferably has a lubricant 100 applied between the contact portions $24a$ and $24b$ of the output terminal 24, as shown in FIGS. 2 and 3A. The lubricant 100 preferably exists in at least a visible quantity adjacent to four corners of the bent contact portion $24b$, or over the entire surface of the bent contact portion $24b$.

Figure 8A:
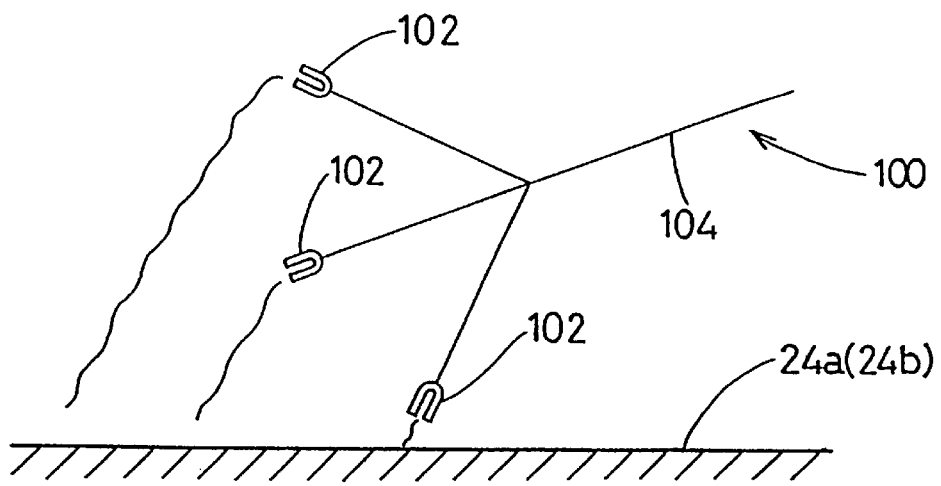
FIGS. 8A and 8B are diagrams showing how the molecular structure of the lubricant shown in FIGS. 6 and 7 adheres to the terminal in a desired position.
Figure 8B:
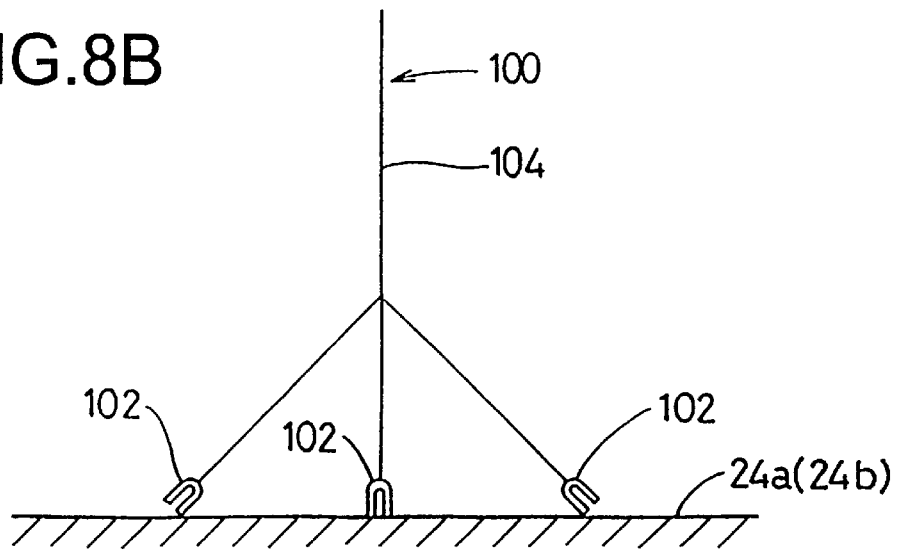

The lubricant molecule 100 schematically shown in FIGS. 8A and 8B preferably contains a hydrophilic group 102 which tends to form a hydrogen bond with a metal element and a lipophilic group 104 preferably extending in a straight chain from any such hydrogen bond and having a length which is at least several times that of the hydrophilic group 102, as shown in FIGS. 6, 8A and 8B. The lipophilic group 104 preferably has a molecular structure which urges it away from the surfaces of the terminal or the metallic surfaces of the base and bent contact portions $24a$ and $24b$ which surround the lubricant 100.

The lubricant 100 is preferably a non-ionic surface active agent except one having a cyclic molecular structure as a whole, or a higher fatty acid ester except one having a cyclic molecular structure as a whole. More specifically, the lubricant 100 may, for example, include a polyethylene glycol fatty acid ester or polyethylene glycol alkyl ether.

Figure 3B:
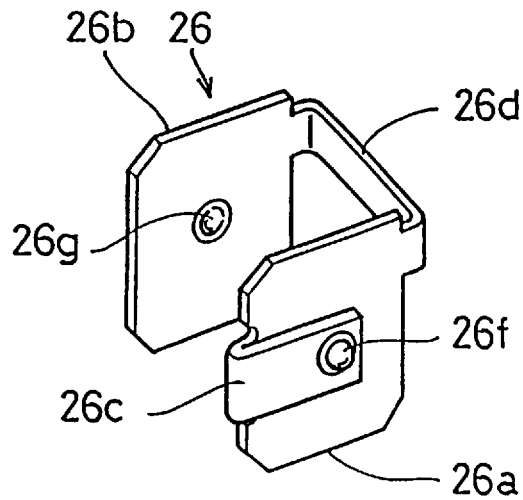
FIG. 3B is a perspective view of the relay terminal having a bent portion in the filter of FIGS. 1A and 1B.
Figure 4:
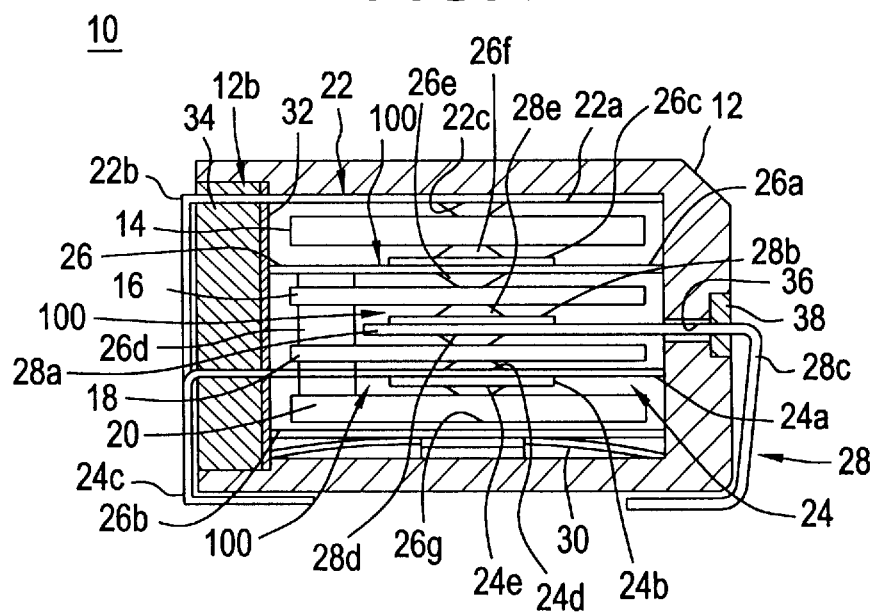
FIG. 4 is a cross sectional view of another preferred embodiment of the present invention.

The relay terminal 26 preferably has two base contact portions $26a$ and $26b$, a bent contact portion $26c$ folded over the base contact portion $26a$, a relay portion $26d$ and three protrusions $26e$, $26f$ and $26g$ disposed on the contact portions $26a$, $26c$ and $26b$, respectively, as shown in FIGS. 2 and 3B. The protrusion $26e$ is resiliently disposed against the lower surface of the piezoelectric element 14, the protrusion $26f$ against the upper surface of the piezoelectric element 16 and the protrusion $26g$ against the lower surface of the piezoelectric element 20.

The earth terminal 28 has a base contact portion 28a, a bent contact portion 28b folded over the base contact portion 28a, an external connector 28c and two protrusions 28d and 28e formed on the base and bent contact portions 28a and 28b, respectively, as shown in FIGS. 1A and 2. The protrusion 28d is resiliently disposed against the upper surface of the piezoelectric element 18 and the protrusion 28e against the lower surface of the piezoelectric element 16.

The spring terminal 30 is held between the inner bottom surface of the casing 12 and the contact portion 26b of the relay terminal 26 for exerting an appropriate pressure on the piezoelectric elements 14, 16, 18 and 20 and the input terminal 22, the output terminal 24, the relay terminal 26 and the earth terminal 28 to hold the terminals together.

The elements 14, 16, 18 and 20 and the terminals 22, 24, 26, 28 and 30 are inserted into the casing 12 through the opening 12a. The casing 12 has around its opening 12a a shoulder 12b across which an insulating material 32 is preferably applied.

The external connectors 22b and 24c of the input and output terminals 22 and 24, respectively, project from the casing 12 through its opening 12a. The opening 12a is preferably sealed with a sealing material 34, such as an epoxy resin, bonded to the casing 12. The casing 12 has a slit 36 formed in a wall of the casing 12 located opposite from its opening 12a and the external connector 28c of the earth terminal 28 projects from the casing 12 through the slit 36. The slit 36 is sealed with a sealing material 38, such as an epoxy resin.

The external connectors 22b, 24c and 28c project through the hardened sealing materials 34 and 38 and are bent along the outside and bottom of the casing 12, as shown in FIG. 2. Instead of being bent along the bottom of the casing 12, however, the external connectors 22b, 24c and 28c may alternatively be bent away from the casing 12 so as to extend in the same plane with a bottom of the casing 12.

Attention is directed to FIG. 1B showing an equivalent circuit for the ladder type filter 10. The piezoelectric elements 14 and 20 are connected in series between the input and output terminals 22 and 24. The piezoelectric elements 16 and 18 are connected in parallel between the input and output terminals 22 and 24. The piezoelectric elements 14 and 20 and the piezoelectric elements 16 and 18 are alternately connected to form a ladder structure.

The lubricant 100 prevents any obstruction of vibration between the base and bent contact portions 24a and 24b of the output terminal 24. This makes it possible to eliminate any unbalanced vibration between the terminals and the piezoelectric resonators. It is also possible to reduce any distortion occurring in the piezoelectric elements 14, 16, 18 and 20 and the terminals 22, 24, 26, 28 and 30 as a result of any stress or shock from an external source. The lubricant 100 enables balanced, free vibration between the base and bent contact portions 24a and 24b of the output terminal 24 and thereby prevents any unbalanced vibration between the base and bent contact portions 24a and 24b.

Figure 9:
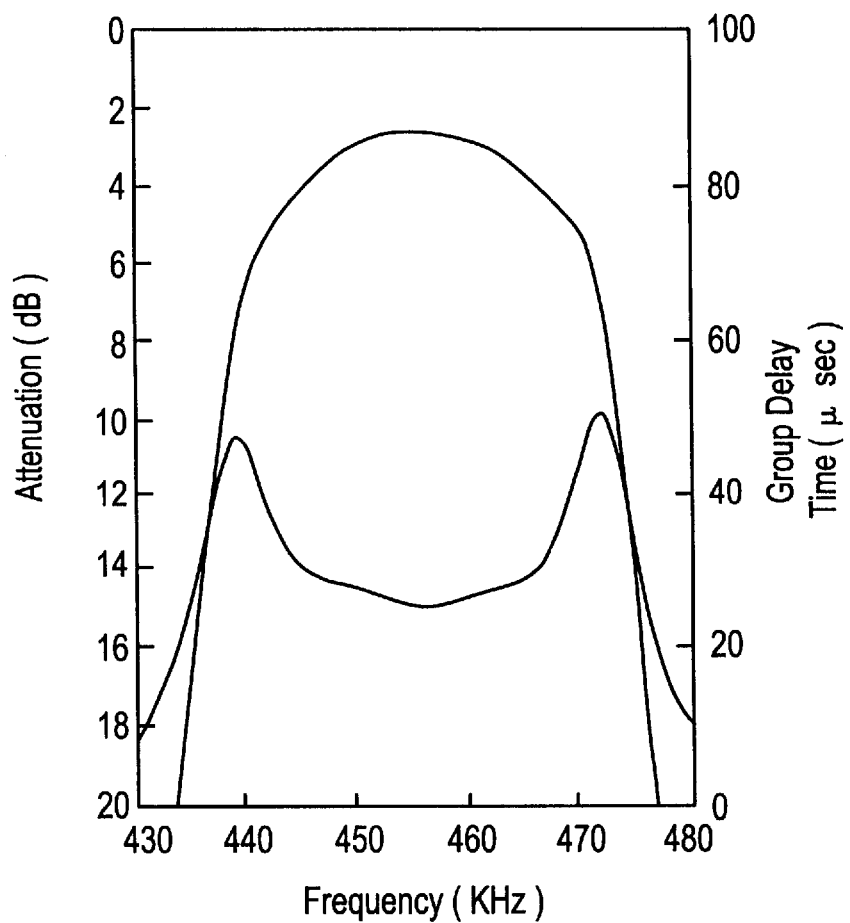
FIG. 9 is a graph showing the characteristics of the filter including the terminals according to a preferred embodiment of the present invention.
Figure 10:
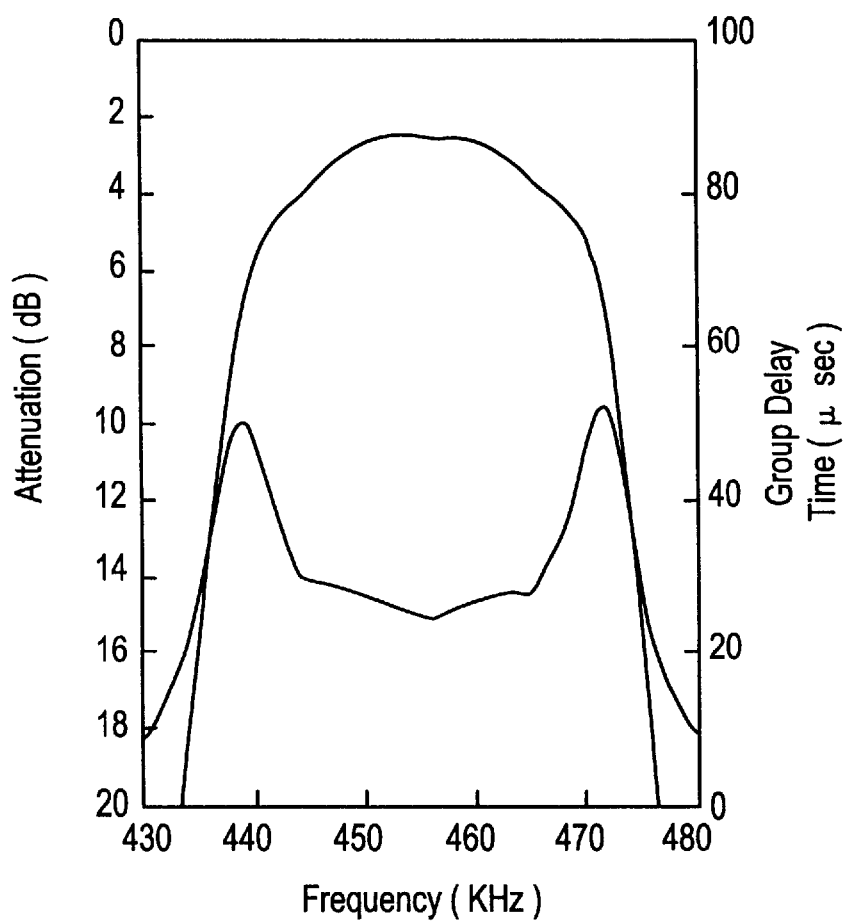
FIG. 10 is a graph showing the characteristics of a ladder type filter including conventional terminals.
Figure 11:
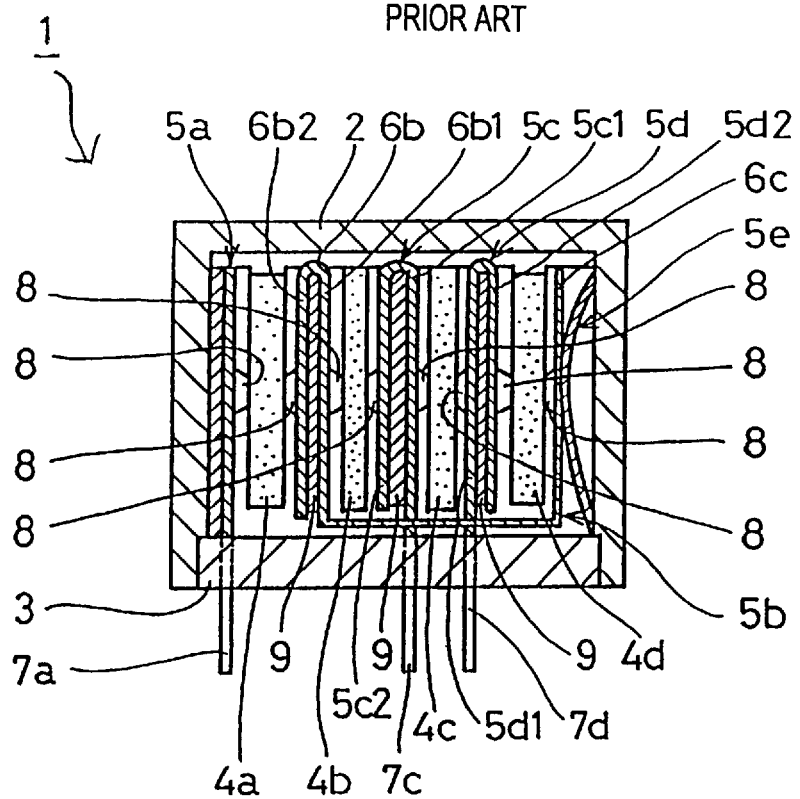
FIG. 11 is a cross-sectional view of a ladder type filter including conventional terminals.
Figure 12:
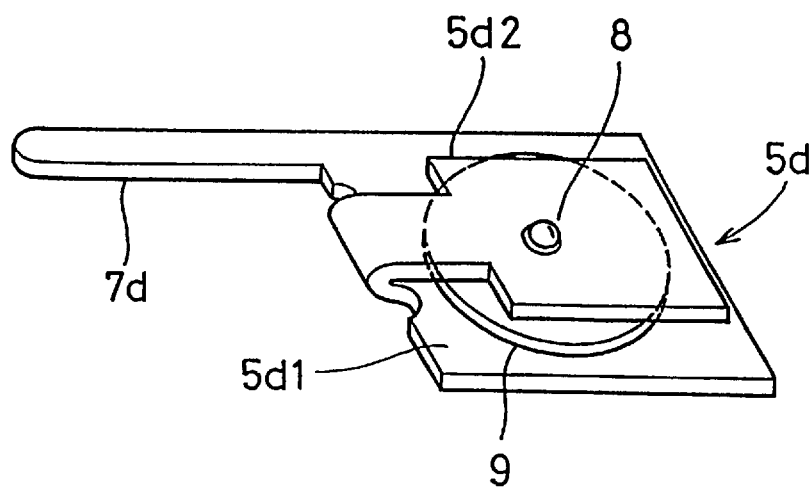
FIG. 12 is a perspective view of the output terminal in the filter shown in FIG. 11.

Therefore, it is possible to prevent any ripple failure from occurring in the frequency and group delay characteristics of the ladder type filter 10 according to the preferred embodiments of the present invention, as is obvious from FIG. 9, for example. On the other hand, a known ladder type filter not having any lubricant has a ripple failure in its frequency and group delay characteristics due to physical stress from an external source and the vibrations of the piezoelectric elements themselves, as is obvious from FIG. 10, since there remains an obstruction to vibration between the base and bent portions of the terminals and vibration other than piezoelectric vibration is produced between the piezoelectric elements and the bent portions of the terminals. The ripple failure lowers the quality of the piezoelectric device.

The lubricant 100 is not easily displaced by stress or gravity from between the base and bent contact portions 24a and 24b of the output terminal 24, but is easily located and secured in position, since the hydrophilic group 102 in the lubricant 100 easily forms a hydrogen bond with the metallic terminal surfaces, such as silver, for example, which may be preferably used to form the terminal surfaces. The formation of this hydrogen bond is usually considered as a kind of physical reaction rather than a chemical reaction forming a compound.

It is considered from a stereochemical standpoint involving the positional relationship between the molecular structure of the lubricant 100 and the metal surface of the terminals that the hydrophilic molecules 102 of the lubricant 100 extend from the terminal surfaces at an angle of over 45° and nearly 90°, as shown in FIG. 8B. The lubricant 100 extends a distance of at least several tens of angstroms from the surfaces of the metallic material forming the contact portions 24a and 24b, insofar as the lipophilic group 104 extending in a straight chain from any hydrogen bond formed by the hydrophilic group 102 with the metal element in the terminal surfaces has a length at least several times that of the hydrophilic group 102, and has a molecular structure which urges the lipophilic group 104 away from the terminal surfaces of the contact portions 24a and 24b.

As a result of the molecular composition and arrangement of the lubricant 100, the lubricant 100 prevents distortion in the piezoelectric elements 14, 16, 18 and 20 and the terminals 22, 24, 26, 28 and 30 resulting from any stress or shock applied thereto from an external source, while allowing balanced, free vibration between the base and bent contact portions 24a and 24b of the output terminal 24.

Description will now be made of a number of methods which can be employed for applying the lubricant 100 between the base and bent contact portions 24a and 24b of the output terminal 24.

According to one preferred method, the metallic material from which the output terminal 24 is to be formed by a press is coated with a working fluid containing the lubricant 100 before it is bent. The starting metallic material is flat and is marked with cut lines conforming to the shape of the output terminal 24. The metallic material is bent by a press to form the bent portion and thereby the output terminal 24. The working fluid coating the metallic material is held in a space located between the contact portions 24a and 24b to form a layer of the lubricant 100 therebetween. Then, the working fluid is removed from any portion not requiring lubricant 100.

According to another preferred method, the lubricant 100 is added into e.g. an organic solvent, and the output terminal 24 as properly shaped is dipped in the solvent, so that the solvent containing the lubricant may fill the space between its contact portions 24a and 24b. It is alternatively possible to spray the solvent containing the lubricant 100 against the output terminal 24 by a nozzle or other suitable device.

As a further alternative, the lubricant 100, or a dilution thereof prepared by using a solvent can be forced by a syringe or other suitable device into the space between the contact portions 24a and 24b of the output terminal 24.

Although the ladder type filter has been described as including the output terminal according to the preferred embodiments of the present invention, this invention is equally applicable to an input terminal, earth terminal or relay (internal connection) terminal, though the output terminal may be the most effective form of its embodiment. It is also possible to make a ladder type filter or other electronic component by employing a plurality of terminals embodying the preferred embodiments of the present invention.

The material from which the casing 12 is formed is not limited to a liquid crystal polymer or ceramic material, but may be replaced by any other material, such as a resin, or metal, if it is sufficiently resistant to heat. The sealing materials 34 and 38 are not limited to an epoxy resin, but may alternatively comprise, for example, a urethane, silicone, or ultraviolet-curing resin.

Another preferred embodiment of the present invention is shown in FIGS. 4, 5A–5D and 7. It is noted that like reference numerals used to describe the first preferred embodiment in FIGS. 4, 5A–5D and 7 have been repeated in the Figures and description of the second preferred embodiment to indicate like structural elements to avoid unnecessary repetition of description.

Figure 5A:
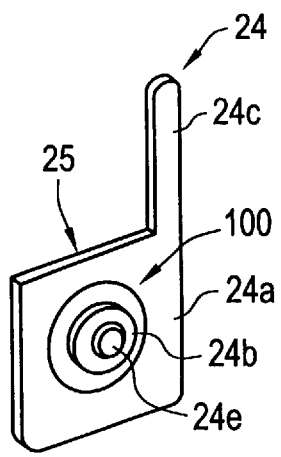
FIG. 5A is a perspective of another preferred embodiment of the output terminal shown in FIG. 4 having two separate portions.

As seen in FIG. 5A, the second preferred embodiment includes a terminal 24 which has a structure that is different from the structure of the terminal 24 shown in FIGS. 3A and 3B. More specifically, the terminal 24 shown in FIG. 5A includes a first contact portion 24a and a second contact portion 24b. The two contact portions 24a, 24b of the terminal 24 are preferably formed separately from each other and are not connected to each other by a bent portion as in the preferred embodiment shown in FIG. 3A. Instead, the portions 24a, 24b are separated by a desirable amount of the lubricant 100.

Figure 5B:
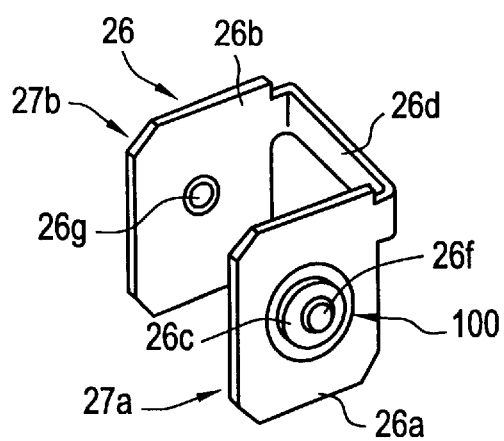
FIG. 5B is a perspective view of the relay terminal shown in FIG. 4 having two separate portions.
Figure 5C:
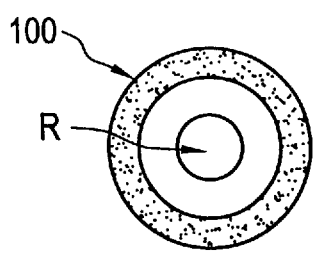
FIG. 5C is a view of the surface of the second portion $24b$.
Figure 5D:
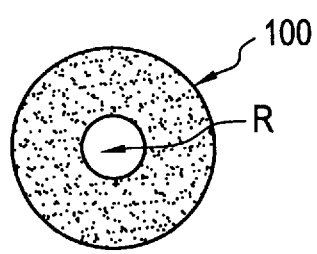
FIG. 5D is a view of the surface of the first portion $24a$.

As seen FIGS. 5C and 5D, the lubricant 100 can be located as indicated by the shaded areas in these Figures. The shaded area in FIG. 5C corresponds to the surface of the first portion 24a opposed to the periphery portion of the surface of the second portion 24b. The shaded area in FIG. 5D corresponds to the surface of the first portion 24a opposed to the entire surface of the second portion 24b except for the indentations R corresponding to the protrusions 24d and 24e.

Figure 7:
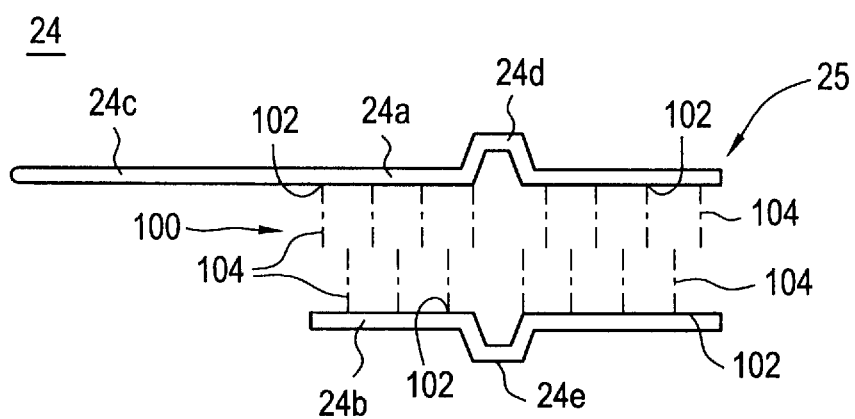
FIG. 7 is a view showing a lubricant applied between the first and second portions of the terminal portion shown in FIG. 5A.

As seen in FIG. 7, the two separate portions 24a and 24b are disposed in contact with the lubricant 100 located therebetween. The lubricant 100 forms the same chemical bond with the two contact portions 24a, 24b as explained with reference to FIG. 6 in the first preferred embodiment of the present invention. Further, the characteristics of the lubricant 100 shown in FIGS. 8A and 8B are also experienced in this second preferred embodiment with the two separate contact portions 24a, 24b.

In a preferred method of assembly, the first contact portion 24a has the lubricant 100 disposed thereon and then the second contact portion 24b is located adjacent the first portion 24a such that the lubricant 100 is located between the first contact portion 24a and the second contact portion 24b.

It should be noted that as seen in FIG. 5B, a relay terminal 26 preferably includes a contact portion 26a as a first portion of the terminal and a second portion contact 26c which is disposed opposite to the first contact portion 26a. Lubricant 100 is preferably located between the first portion 26a and the second portion 26c in a manner similar to the first portion 24a and the second portion 24b of the terminal 24.

The second preferred embodiment including the two separate portions 24a, 24b and 26a, 26c of the terminals 24 and 26 provide the same advantages achieved by the first preferred embodiment as described in the preceding paragraphs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A terminal for a piezoelectric device comprising:
   a contact portion including a first portion and a second portion being separate from each other, the second portion provided over the first portion such that a major surface of the second portion is disposed opposite to a major surface of the first portion; and
   a lubricant disposed between the first portion and the second portion so as to prevent contact between the first portion and the second portion of the contact portion, the lubricant containing a hydrophilic group and a lipophilic group.

2. A terminal as set forth in claim 1, wherein the hydrophilic group is adapted to form a chemical bond with the contact portion.

3. A terminal as set forth in claim 1, wherein the contact portion comprises a metal element and the hydrophilic group is adapted to form a hydrogen bond with the metal contact portion.

4. A terminal as set forth in claim 1, wherein the lipophilic group extends in a straight chain from the hydrophilic group.

5. A terminal as set forth in claim 1, wherein the lipophilic group has a length at least several times that of the hydrophilic group.

6. A terminal as set forth in claim 1, wherein the lipophilic group has a molecular structure which urges the lipophilic group away from the major surfaces of the first portion and the second portion.

7. A terminal as set forth in claim 1, wherein the lubricant comprises a non-ionic surface active agent excluding an agent having a cyclic molecular structure.

8. A terminal as set forth in claim 1, wherein the lubricant comprises a higher fatty acid ester excluding an agent having a cyclic molecular structure.

9. A terminal as set forth in claim 1, wherein each of the first portion and the second portion includes a protrusion disposed thereon.

10. A terminal for a piezoelectric device comprising:
    a first portion;
    a second portion being separate from the first portion and provided over the first portion such that a major surface of the second portion is disposed opposite to a major surface of the first portion while being separated therefrom; and
    a lubricant located between the first portion and the second portion so as to prevent contact between the first portion and the second portion of the contact portion, the lubricant being arranged and having a structure so as to absorb a shock force occurring in a direction substantially perpendicular to the major surface of the second portion and so as to allow free vibration of the second portion relative to the first portion in a direction substantially parallel to the major surface of the second portion, the lubricant containing a hydrophilic group and a lipophilic group.

11. A terminal as set forth in claim 10, wherein the hydrophilic group is adapted to form a hydrogen bond with a metal element and the lipophilic group extends in a straight chain from the hydrogen bond and has a length at least several times that of the hydrophilic group, the lipophilic group having a molecular structure which urges the lipophilic group away from the major surfaces of the first portion and the second portion.

12. A terminal as set forth in claim 10, wherein the lubricant comprises a non-ionic surface active agent excluding an agent having a cyclic molecular structure.

13. A terminal as set forth in claim 10, wherein the lubricant comprises a higher fatty acid ester excluding an agent having a cyclic molecular structure.

14. An electronic component comprising:

a case;

a plurality of piezoelectric resonators provided in the case; and at least one terminal located between one of the piezoelectric resonators and the case or between two of the piezoelectric resonators, the at least one terminal including:

a first portion;

a second portion being separate from the first portion and provided over the first portion such that a major surface of the second portion is disposed opposite to a major surface of the first portion; and a lubricant located between the first portion and the second portion so as to prevent contact between the first portion and the second portion of the contact portion, the lubricant containing a hydrophilic group and a lipophilic group.

15. An electronic component as set forth in claim 14, wherein the lubricant is arranged and has a structure so as to absorb a shock force occurring in a direction substantially perpendicular to the major surface of the second portion and so as to allow free vibration of the second portion relative to the first portion in a direction substantially parallel to the major surface of the second portion.

16. An electronic component as set forth in claim 14, wherein the second portion and the first portion each comprise a metal element and the hydrophilic group is adapted to form a hydrogen bond with the metal second portion and metal first portion.

17. An electronic component as set forth in claim 14, wherein the lipophilic group extends in a straight chain from the hydrophilic group and has a length at least several times that of the hydrophilic group.

18. A terminal as set forth in claim 14, wherein the lipophilic group has a molecular structure which urges the lipophilic group away from the major surfaces of the first portion and the second portion.

19. A terminal as set forth in claim 14, wherein the lubricant comprises a non-ionic surface active agent excluding an agent having a cyclic molecular structure.

20. A terminal as set forth in claim 14, wherein the lubricant comprises a higher fatty acid ester excluding an agent having a cyclic molecular structure.

* * * * *